US006304099B1

(12) United States Patent
Tang et al.

(10) Patent No.: US 6,304,099 B1
(45) Date of Patent: Oct. 16, 2001

(54) METHOD AND STRUCTURE FOR DYNAMIC IN-SYSTEM PROGRAMMING

(75) Inventors: Howard Y. M. Tang, San Jose; Albert Chan, Palo Alto; Cyrus Y. Tsui, Los Altos; Ju Shen, Milpitas, all of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/083,335

(22) Filed: May 21, 1998

(51) Int. Cl.$^7$ ............................ G06F 7/38; H03K 19/173; G01R 31/28
(52) U.S. Cl. .............................. 326/38; 326/40; 714/726; 714/727
(58) Field of Search ................................ 326/38, 39, 40, 326/41; 371/22, 32; 364/490; 714/726, 727

(56) References Cited

U.S. PATENT DOCUMENTS

| | | | |
|---|---|---|---|
| 5,237,218 | * | 8/1993 | Josephson et al. ...................... 326/38 |
| 5,412,260 | * | 5/1995 | Tsui et al. ............................... 326/39 |
| 5,635,855 | * | 6/1997 | Tang ....................................... 326/38 |
| 5,734,868 | * | 3/1998 | Curd et al. ............................. 395/500 |
| 5,841,867 | * | 11/1998 | Jacobson et al. ....................... 380/25 |
| 5,864,486 | * | 1/1999 | Deming et al. ....................... 364/489 |
| 5,869,979 | * | 2/1999 | Bocchino ............................... 326/38 |
| 5,949,987 | * | 9/1999 | Curd et al. ....................... 395/500.17 |

OTHER PUBLICATIONS

Maunder et al., "IEEE Standard Test Access Port and Boundary–Scan Architecture", IEEE Std 1149.1, pp. 5-1–5-16, Feb. 1990.*

* cited by examiner

*Primary Examiner*—Michael Tokar
*Assistant Examiner*—Daniel D. Chang
(74) *Attorney, Agent, or Firm*—Skjerven Morrill MacPherson, LLP; Edward C. Kwok, Esq.

(57) ABSTRACT

An input/output circuit in an In-system programmable (ISP) logic device allows an output signal from a boundary scan register to be provided as output during programming operations of said ISP logic device. Thus, the ISP logic circuit can provide valid data output to other circuits interfaced to the ISP logic circuit during programming of the ISP logic device, thereby obviating a need to reset the system after reprogramming of the ISP logic device.

5 Claims, 3 Drawing Sheets

METHOD AND STRUCTURE FOR DYNAMIC IN-SYSTEM PROGRAMMING

BACKGROUND OF THE INVENTION

1. Field of the Invention

The present invention relates to In-System Programming of programmable integrated circuits. In particular, the present invention relates to reprogramming a programmable integrated circuit in its operational environment without requiring reset of the system in which the programmable integrated circuit is a part.

2. Discussion of the Related Art

In-system programming (ISP) refers to a technique by which a programmable logic device (PLD), e.g., a complex PLD (CPLD) or a field programmable gate array (FPGA) can be reprogrammed or reconfigured without being taken out of its operational environment, such as a printed circuit board. In-System programming techniques are disclosed, for example, in U.S. Pat. No. 5,237,218, entitled "Structure and Method for Multiplexing Pins for In-System Programming" to Josephson et al, and in U.S. Pat. No. 5,635,855, entitled "Method for Simultaneous Programming of In-System Programmable Integrated Circuits," to Tang et al.

Typically, upon entering ISP mode, e.g., by asserting an ISP signal, programming data and commands are shifted serially into an in-system programmable integrated circuit via a serial input pin synchronized by a programming clock signal. During programming, the input and output pins of the ISP integrated circuit are put into a "high impedance" state. Consequently, output signals driven by the integrated circuit to be received into other circuits in the system become indeterminate. Thus, even though ISP can be performed without removal from the system, the system is required to be reset during and after programming to ensure proper operations. In certain applications, such reset operations interrupt service and can be difficult to carried out without manual intervention (e.g., system deployed in satellites), or can be time consuming. Thus, an ability to perform ISP without requiring a reset of the system is desired.

Many ISP integrated circuits also provide support for the IEEE 1149.1 test standard (popularly known as the "boundary scan" or "JTAG" test standard). Under the boundary scan standard, a boundary scan register is provided for each input or output pin of the integrated circuit. Each boundary scan register stores a logic value which can be driven out of the integrated circuit as an output signal of its associated output pin, or driven internally as an input signal from an input pin. One example of an implementation of the boundary scan standard in a PLD is disclosed in U.S. Pat. No. 5,412,260, entitled "Multiplexed Control Pins for In-System Programming and Boundary Scan State Machines in a High Density Programmable Logic Device" to Tsui et al.

SUMMARY OF THE INVENTION

The present invention provides, in an In-system programmable (ISP) logic device, both a method and an input/output circuit which allow an output signal from a boundary scan register to be provided as output during programming operations of the ISP logic device. Thus, the ISP logic circuit can shift data through the boundary scan chain to provide valid data output to other circuits interfaced to the ISP logic circuit during programming of the ISP logic device, thereby obviating a need to reset the system during and after reprogramming of the ISP logic device.

A method of the present invention includes: (a) providing, in the programmable logic circuit, a scan chain formed out of boundary scan registers associated with a number of input/output pins; and (b) providing a state machine for controlling both programming operations of the programmable logic circuit and boundary scan operations of the scan chain. The state machine configures the scan chain such that data in the boundary scan registers are provided to the input/output pins when the programming operations are carried out.

According to one aspect of the present invention, the state machine executes a number of instructions, including an instruction which both initiates a programming operation of the programmable logic circuit and configures the scan chain to allow data shifting in the scan chain. In one embodiment, the programming operation is not terminated when a subsequent instruction for shifting data into and out of the scan chain is executed. In that embodiment, the state machine executes another instruction for terminating the initiated programming operation.

In one embodiment, the initiated programming operation programs a predetermined number of architecture cells in the programmable logic circuit. In another embodiment, the initiated programming operation erases a predetermined number of architecture cells in the programmable logic circuit.

According to another aspect of the present invention, an ISP logic device of the present invention includes: (a) a programmable logic circuit providing a number of output signals; and a number of output circuits each including: (i) an input/output pin; (ii) a boundary scan register providing an output signal; and (iii) a multiplexer, which receives one of the output signals from the programmable logic circuit and the output signal from the boundary scan register. The multiplexer is configured to provide on the output pin, in response to a control signal indicating that the ISP logic device is being programmed, the output signal from the boundary scan register. The boundary scan registers of the output circuits can be configured to form a scan chain receiving serial input data from a serial input pin and providing serial output data at a serial output pin.

In one embodiment, the ISP logic device further includes a state machine providing the control signal to the multiplexer in accordance with a second control signal received at an input pin.

In another embodiment, the output pin of the output circuit is implemented as a bidirectional interface circuit which can be configurable to receive an input signal and to provide the input signal as input to the programmable logic circuit, even when the ISP logic device is being programmed.

The state machine of the ISP logic device controls both programming operation of the programmable logic circuit and operations of the scan chain. That state machine allows operations of the scan chain to be active simultaneously with the programming operations.

The present invention is better understood upon consideration of the detailed description below and the accompanying drawings.

DETAILED DESCRIPTION OF THE PREFERRED EMBODIMENTS

Figure 1:
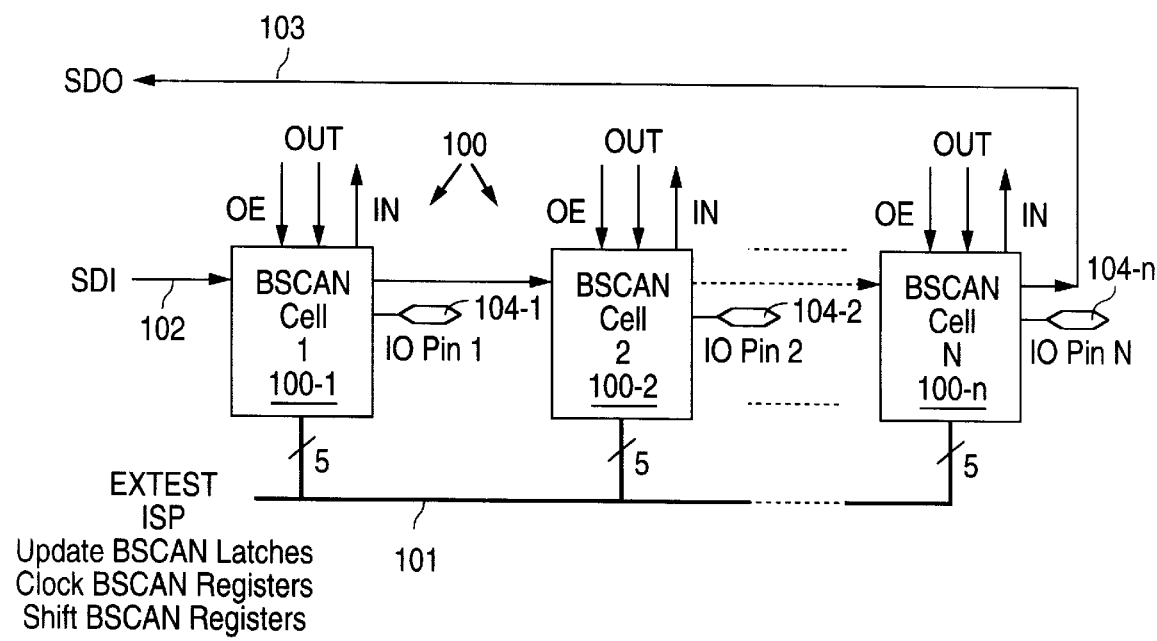
FIG. 1 shows schematically a scan chain configured in input/output (I/O) cells 100-1, . . . , 100-n of an ISP PLD 300, in accordance with one embodiment of the present invention.

The present invention provides an In-system programmable integrated circuit, such as a programmable logic device (PLD), which does not require external circuits connected to the integrated circuit to reset upon completion of In-System Programming (ISP). In the following description, although the present invention is illustrated using as example an In-System Programmable PLD (ISP PLD), one of ordinary skill in the art will appreciate that the present invention is applicable to all in-system programmable devices, including complex PLDs (CPLDs) and field programmable gate arrays (FPGAs). To facilitate reference among the various figures accompanying this detailed description, like elements in these figures are provided like reference numerals.

Figure 3:
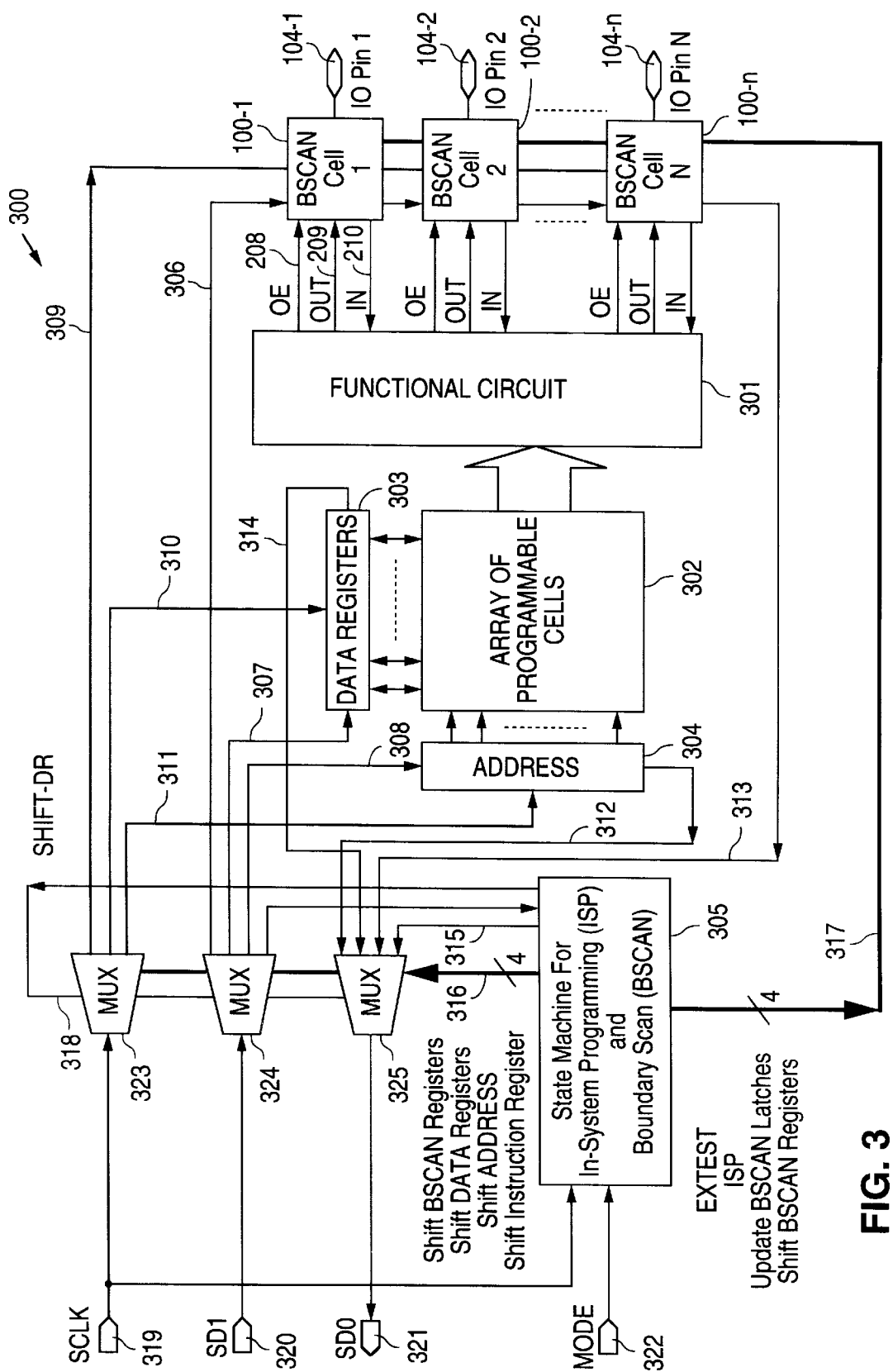
FIG. 3 is a block diagram of ISP PLD 300.

FIG. 3 is a block diagram representing an ISP PLD 300. As shown in FIG. 3, ISP PLD 300 includes a functional circuit 301, which is configured according to the logic values of bits in programmable architecture cells 302. Functional circuit 301 can be configured to receive input signals (e.g. the input signal at terminal 210) from input/output (I/O) cells 100-1, 100-2, . . . , 100-n, and/or provide output signals (e.g., the output signal at terminal 209) to I/O cells 100-1, 100-2, . . . , 100-n. The output signals provided by functional circuit 301 can be placed onto I/O pins 100-1, 100-2, . . . , 100-n under the control of output enable signals (e.g., the output enable signal at terminal 208) from functional circuit 301.

Architecture cells 302 are programmed through a data register 303 and an address register 304. Data register 303 and address register 304 and each of I/O cells 100-1, 100-2, . . . , 100-n are clocked by clock signals at terminal 310, 311 and 311 respectively. The clock signals at terminal 310, 311 and 309 are each coupled by selector 323 selectively to an input clock signal received at input clock "SCLK" pin 319. I/O cells 100-1, 100-2, . . . , 100-n include boundary scan registers which can be configured into a scan chain between input terminal 306 and output terminal 313. Data register 303, address register 304 and each of I/O cells 100-1, 100-2, . . . , 100-n can receive data serially at terminals 307, 308 and 306 respectively. Terminals 307, 308 and 306 are selectively coupled by selector 324 to receive input serial data at serial input ("SDI") pin 320. The data in data register 303 and address register 304, and each of I/O cells 100-1, 100-2, . . . , 100-n can be shifted out serially at terminals 314, 312 and 313, respectively. The data at terminals 314, 312 and 313 can be provided selectively by multiplexer 325 to output ("SDO") pin 321.

Data register 303, address register 304, each of I/O cells 100-1, 100-2, . . . , 100-n, selectors 323 and 324 and multiplexer 325 are controlled by a state machine 305, which provides control signals at the control terminals indicated by reference numerals 316 and 317. These control signals are active during both boundary scan operations and ISP operations. ISP operations are indicated by a control signal received at control ("mode") pin 322. Instructions for state machine 305 are held in an instruction register 326 (not shown).

FIG. 1 shows schematically a scan chain formed by I/O cells 100-1, 100-2, . . . , 100-n of ISP PLD 300, in accordance with one embodiment of the present invention.

As shown in FIG. 1, I/O pins 104-1, 104-2, . . . , 104-n of an ISP PLD are each associated with one of I/O cells 100-1, 100-2, . . . , 100-3. I/O cells 100-1, 100-2, . . . , 100-n are connected serially to allow data to be shifted in from a serial data input terminal (SDI) 102, through each of I/O cells 100-1, 100-2, . . . , 100-n, and shifted out at serial data output terminal (SDO) 103. Each of I/O cells 100-1, 100-2, . . . , 100-n can be implemented by I/O cell 200 of FIG. 2.

Figure 2:
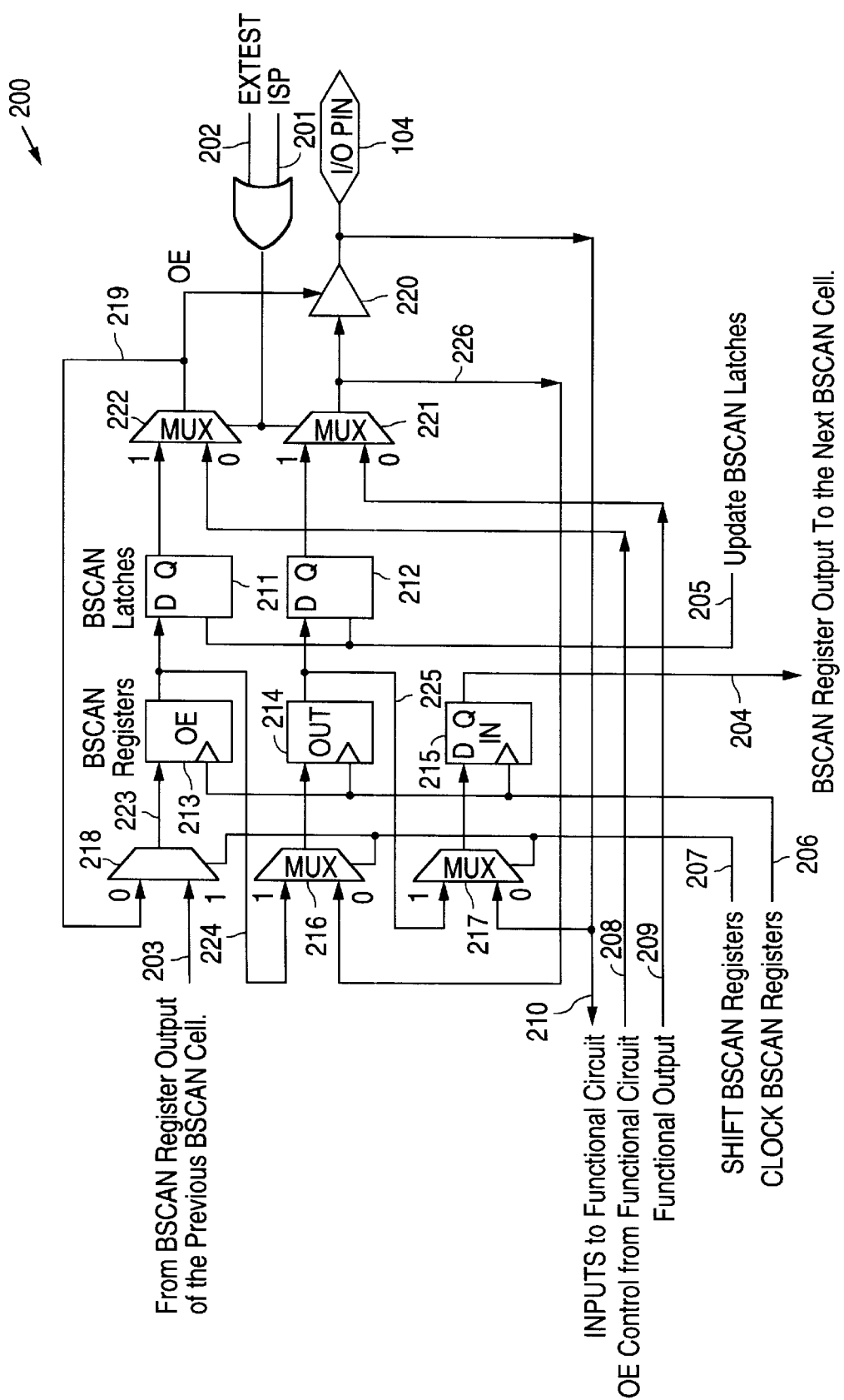
FIG. 2 shows an I/O cell 200 which can be used to implement each of I/O cells 100-1, 100-2, . . . , 100-n of FIG. 1.

As shown in FIG. 2, I/O cell 200 receives a serial data input signal at terminal 203 and provides a serial data output signal at terminal 204. In addition, I/O cell 200 receives a control signal "EXTEST" at terminal 202, a control signal "ISP" at terminal 201, a control signal "shift" at terminal 207, a control signal "update" at terminal 205, and a clock signal "clock" at terminal 208. A number of boundary scan registers 213, 214 and 215 are provided in I/O cell 200. In addition, I/O cell 200 receives an output enable signal OE at terminal 208 and an output data signal at terminal 209 from functional circuit 301 (e.g., programmable logic arrays) in the ISP PLD. I/O cell 200 also provides an input data signal at terminal 210 to the functional circuit 301.

To provide an output signal at pin 104, output enable signal OE at terminal 219, when asserted, activates output buffer 220. Output enable signal OE can be provided by an output signal of latch 211, during boundary scan and ISP operations, or as an internally generated output signal at terminal 208, during functional operations Similarly, the output data bit can be provided by latch 212, during boundary scan and ISP operations, or as an internally generated data signal at terminal 209, during functional operations.

During boundary scan operations, control signal "EXTEST" at terminal 202 is asserted. During ISP operations, control signal "ISP" at terminal 201 is asserted. In either set of operations, a scan chain can be configured including multiplexer 218, register 213, multiplexer 216, register 214, multiplexer 217 and register 215. When the "shift" signal at terminal 207 is asserted and according to clock signal "clock" at terminal 206, a data bit at terminal 203 can be shifted through this scan chain into I/O cell 200 at terminal 203 and shifted out of I/O cell 200, either at terminal 204, or through scan latch 212, multiplexer 221 and buffer 220 for output I/O pin 104. Typically, during boundary scan operations, terminal 204 of I/O cell 200 is coupled to the input terminal corresponding to terminal 203 in an adjacent I/O cell. At any time during boundary scan operations (i.e., signal "EXTEST" asserted) or ISP operations (i.e., signal "ISP" asserted), latches 211 and 212 can be loaded from registers 213 and 214 by asserting control signal "update" at terminal 205. Output enable signal OE at terminal 219 and data bit at terminal 226 can be latched into registers 213 and 214 by the feedback paths at terminals 219 and 226, respectively.

Note that, in the prior art, if output pin 104 receives an output signal from a functional circuit, the value of the output signal can become indeterminate or unpredictable during ISP operations, as the functional circuit is reconfigured. However, unlike the prior art, under control of state machine 305, to be described in further detail below, I/O cell 200 allows control signals "EXTEST" and "ISP" to be asserted during boundary scan and ISP operations, so that a data signal of known logic value can be placed onto output pin 104 at selected times.

Figure 4:
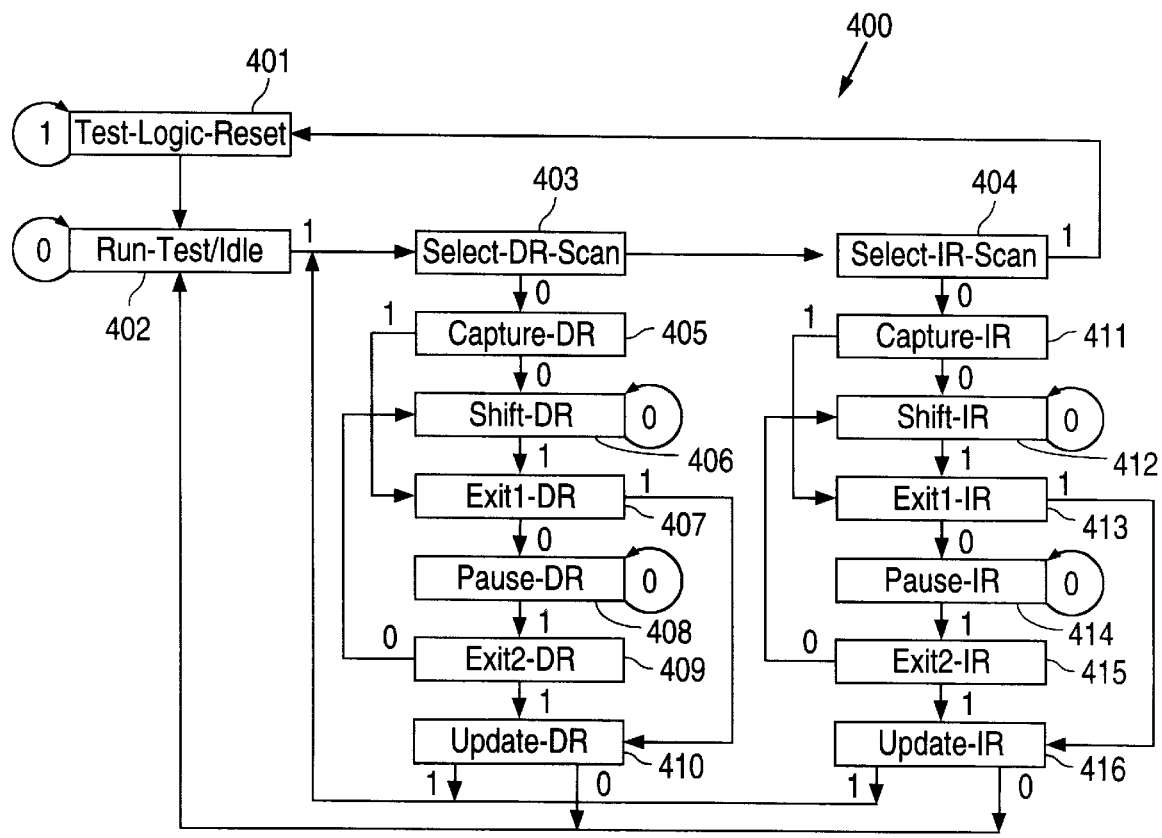
FIG. 4 is a flow diagram 400 of state machine 305 of FIG. 3.

A flow diagram 400 of state machine 305 is shown in FIG. 4. As shown in FIG. 4, state machine 305 starts from an initial state 401 ("test logic/reset" state). Initial state 401 can be returned to at any time by asserting the ISP mode control signal at mode pin 322 for 5 periods of the clock signal at SCLK pin 319. From initial state 401, state machine 305 can enter into a run state ("run test/idle" state) 402, a shift data state ("select-DR-scan" state) 403, and a shift instruction state ("select-IR-scan" state) 404. From shift data state 403, a data register capture state ("capture-DR" state) 405 can be reached which captures the current output values of the specified data register for later operations, such as shifting out. For example, during boundary scan operations, the output data at terminal 226 and the output enable control bit at terminal 219 data can be captured into registers 213 and 214 respectively. Shift states 406–409 allow bits in an input data stream to be serially shifted into the specified register, and the contents of the specified register to be serially shifted out. The shifted data are provided as output data (e.g., by latching captured data in registers 213 and 214 into latches 211 and 212) at a data register update state ("update-DR") 410. Similarly, from shift instruction state 404, the instruction register capture state ("capture-IR" state) captures the instruction in instruction register 326. Shift states 412–415 shift an instruction serially into instruction register 326 and concurrently serially shift the current instruction out of instruction register 326. The shifted instruction is committed at instruction register update ("update-IR" state) 416.

The relevant instructions of state machine 305 are set forth in the following table:

| Instruction | Operation | Description |
| --- | --- | --- |
| 00000 | EXTEST | Performs Boundary scan operations. Asserts control signal EXTEST. |
| 00001 | ADDSHFT | Shifts address register. Asserts ISP control signal. |
| 00010 | DATASHIFT | Shifts Data register. Asserts ISP control signal. |
| 00011 | UBE | User Bulk Erase. Asserts ISP control signal. |
| 00111 | PRGM | Programs a row of architecture cells. Asserts ISP control signal. Stops when exits "run-test/idle" state. |
| 01000 | PRGM + EXTEST | Programs a row of architecture cells. Asserts EXTEST control signal. Programming is stopped by the STOP instruction. |
| 11110 | USERMODE | Enters user mode. Deasserts ISP and EXTEST control signals. |
| 01010 | VERIFY | Verifies data by transferring a specified row of architecture cells to the data register. Asserts control signal ISP. |
| 01011 | STOP + EXTEST | Terminates programming and initiates boundary scan operations. Asserts control signal EXTEST. |
| 10000 | ERASE + EXTEST | Initiates bulk erase and asserts control signal EXTEST. |
| 11100 | SAMPLE/PRELOAD | Captures data into boundary scan registers and latches. Leaves control signals ISP and EXTEST unaffected. |
| 11000 | HIGHZ | sets all I/O pins tristate. |
| 11111 | BYPASS | Couples SDI and SDO pins to the bypass register. Leaves control signals ISP and EXTEST unaffected. |

Two examples are provided in the following to illustrate using the present invention for in-system programming without requiring system reset.

The first example uses the EXTEST instruction to provide output signals at I/O pins while erasing and programming the functional circuit ("Partial Dynamic ISP"):

Step 1.1: enter initial state 401.

Step 1.2: enter shift instruction state 412.

Step 1.3: shift the SAMPLE/PRELOAD instruction into instruction register; step state machine 305 to instruction register update state 416 to update the instruction register, and run state 402 to execute the SAMPLE/PRELOAD instruction.

Step 1.4: step state machine 305 to data register capture state 405 to capture the values the logic signals at the I/O pins into the boundary scan registers.

Step 1.5: step to data register update state 410 to latch the data in the boundary scan registers into the boundary scan latches.

Step 1.6: step to instruction register shift state 412 to shift into instruction register the instruction EXTEST.

Step 1.7: step to instruction register update state 416 to update the instruction register with the EXTEST instruction, thereby asserting control signal EXTEST. (I/O pins of the I/O cells are now decoupled from the functional circuit and provide output signals from boundary scan latches, such as latch 212 of FIG. 2).

Step 1.8: If necessary, shifts additional data into the boundary scan chain, stepping through data register shift state 406 to data register update state 410. (Data on the I/O pins can change states during this step, even though the boundary scan registers are now decoupled from the functional circuit).

Step 1.9: step state machine 305 to instruction register shift state 404 and instruction register update state 416 to shift in and update the instruction register with the UBE instruction. (the configuration of functional circuit 301 is now erased; the ISP control signal is asserted to allow output values at I/O pins to be maintained)

Step 1.10: enter run 402 state for 200 milliseconds to allow complete erasure of the device.

Step 1.11: enter shift data state 403 to exit run state 402 and to terminate the erasure step.

Step 1.12: repeat steps 1.6 to 1.8 to enter new output data for the I/O cells.

Step 1.13: enter instruction register state 412 to shift in the ADDSHFT instruction.

Step 1.14: enter data register shift state 406 to shift an address into an address register.

Step 1.15: If necessary, repeat steps 1.6 to 1.8 to allow new data at the I/O pins.\

Step 1.16: enter instruction register shift state 412 to shift into instruction register 326 the DATASHFT instruction.

Step 1.17: enter data register shift state 406 to shift a row of architecture cell data into a data register.

Step 1.18: enter instruction register shift state 412 and instruction register update state 416 to shift in the PRGM instruction and to update the instruction register.

Step 1.19: step to run state 402 to initiate programming. (Programming typically requires 10 millisecond per row).

Step 1.20: after 10 milliseconds, terminate programming by exiting run state 402.

Step 1.21: repeat steps 1.6 to 1.8 to shift in new output data.

Step 1.22: repeat steps 1.13 to 1.21 until all rows of architecture cells in the device are programmed.

Step 1.23: enter instruction register shift state 412 to shift in instruction USERMODE and instruction register update state 416 to update the instruction register.

Step 1.24: step to run state 402 to execute the instruction USERMODE, which resets control signal ISP (At this point, the functional circuit is fully configured and given control of any I/O pin, as programmed.)

Step 1.25: step to initial state 401 to resume normal operation.

The second method illustrates the use of PRGM+ EXTEST and ERASE+EXTEST instructions, carrying out ISP and boundary scan operations concurrently ("Fully Dynamic ISP"):

Step 2.1: enter initial state 401.

Step 2.2: enter instruction register shift state 412.

Step 2.3: shift the SAMPLE/PRELOAD instruction into instruction register; step state machine 305 to instruction register update state 416 to update the instruction register, and run state 402 to execute the SAMPLE/PRELOAD instruction.

Step 2.4: step state machine 305 to data register capture state 405 to capture the values of the logic signals at the I/O pins into the boundary scan registers.

Step 2.5: step to data register update state 410 to latch the data in the boundary scan registers into the boundary scan latches.

Step 2.6: step to instruction register shift state 412 to shift into instruction register the ERASE+EXTEST instruction.

Step 2.7: step to instruction register update state 416 to update the instruction register with the ERASE+EXTEST instruction, thereby asserting control signal EXTEST. (I/O pins of the I/O cells are now decoupled from the functional circuit and provide output signals from boundary scan latches, such as latch 212 of FIG. 2).

Step 2.8: If necessary, shifts additional data into the boundary scan chain, stepping through data register shift state 406 to data register update state 410. (Data on the I/O pins can change states during this step, even though the boundary scan registers are now decoupled from the functional circuit).

Step 2.9: enter run state 402 state for 200 milliseconds to allow complete erasure of the device (Exiting run state 402 does not terminate erase operation)

Step 2.10: step to data register shift state 406 to shift serial data into the boundary scan chain and to data register update state 410 to output, where appropriate, the data bits at designated I/O pins.

Step 2.11: repeat step 2.10 as many times as necessary to provide suitable output data at the I/O pins.

Step 2.12: if necessary, after 200 milliseconds, enter instruction register shift state to shift into the instruction register the STOP+EXTEST to terminate the erase operations and to allow immediate access to the boundary scan registers. Repeat step 2.10 as many times as necessary until ready to proceed to step 2.13.

Step 2.13: step from instruction register shift state 412 to instruction register update state 416 to shift in the ADDSHFT instruction and to update the instruction register. If step 2.12 was not carried out, the erase operations cease at this step.

Step 2.14: enter instruction register shift state 406 to shift an address into an address register.

Step 2.15: enter data register shift state 406 to shift a row of architecture cell data into a data register.

Step 2.16: enter instruction register shift state 412 and instruction register update state 416 to shift in the PRGM+ EXTEST instruction and to update the instruction register. Immediate access to the boundary scan register is provided.

Step 2.17: step to run state 402 to initiate programming. (Programming typically requires 10 millisecond per row, exit from "run-test/idle" state 402 does not stop programming).

Step 2.18: enter instruction register shift state 412 to shift in the DATASHFT instruction.

Step 2.19: enter data register shift state 406 to shift additional data into the boundary scan chain, and data register update state 410 to provide the shifted data as output at the I/O pins.

Step 2.20: repeat steps 2.18–2.19 as many times as necessary.

Step 2.21: after 10 milliseconds, if access to boundary scan registers is necessary, enter instruction register shift state 412 to shift instruction STOP+EXTEST to gain immediate access to boundary scan register; repeat Steps 2.18 to 2.19 as many times as necessary.

Step 2.22: repeat steps 2.13 to 2.21 until all rows of architecture cells in the device are programmed.

Step 2.23: enter instruction register shift state 412 to shift in instruction USERMODE and instruction register update state 416 to update the instruction register.

Step 2.24: step to run state 402 to execute the instruction USERMODE, which resets control signal ISP (At this point, the functional circuit is fully configured and given control of any I/O pin, as programmed.)

Step 2.25: step to initial state 401 to resume normal operation.

The above detailed description is provided to illustrate the specific embodiments of the present invention and is not intended to be limiting. Numerous modifications and variations within the scope of the invention are possible The present invention is set forth in the following claims.

We claim:

1. A method for In-system programming, comprising:

providing, in a programmable logic circuit, a scan chain comprising of boundary scan registers of associated with a plurality of input/output pins; and providing a state machine for controlling both programming operations of said programming logic circuit and boundary scan operations of said scan chain, wherein said state machine configures said scan chain such that data in said boundary scan registers are provided to said plurality of input/output pins when said programming operations are carried out, and wherein said state machine executes a plurality of instructions including an instruction which both initiates a programming operation of said programmable logic circuit and configures said scan chain to allow data shifting in said scan chain.

2. A method as in claim 1, wherein said programming operation is not terminated when a subsequent instruction for shifting data into and out of said scan chain is executed.

3. A method as in claim 1, wherein said initiated programming operation programs a plurality of architecture cells in said programmable logic circuit.

4. A method as in claim 1, wherein said initiated programming operation erases a plurality of architecture cells in said programmable logic circuit.

5. A method as in claim 1, further including providing an instruction for terminating said initiated programming operation.

* * * * *